United States Patent
Lee et al.

(10) Patent No.: US 11,702,736 B2
(45) Date of Patent: Jul. 18, 2023

(54) METHOD OF MANUFACTURING AND MODULARIZING ASSEMBLED THERMAL MANAGEMENT MATERIAL BASED ON DIAMOND-GRAPHENE HYBRID STRUCTURE

(71) Applicant: KOREA INSTITUTE OF SCIENCE AND TECHNOLOGY, Seoul (KR)

(72) Inventors: Jae Kap Lee, Seoul (KR); Hyunsu Ju, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 218 days.

(21) Appl. No.: 17/155,992

(22) Filed: Jan. 22, 2021

(65) Prior Publication Data

US 2021/0238737 A1      Aug. 5, 2021

(30) Foreign Application Priority Data

Feb. 5, 2020  (KR) .......................... 10-2020-0013828

(51) Int. Cl.
    *C23C 16/27*     (2006.01)
    *H01L 23/373*    (2006.01)

(52) U.S. Cl.
    CPC .......... *C23C 16/27* (2013.01); *H01L 23/3732* (2013.01); *H01L 23/3737* (2013.01)

(58) Field of Classification Search
    CPC .................................................... C23C 16/24
    See application file for complete search history.

(56) References Cited

U.S. PATENT DOCUMENTS

| 7,776,445 | B2 * | 8/2010 | Lee | ......................... | B82Y 30/00 |
| | | | | | 428/408 |
| 8,318,268 | B2 * | 11/2012 | Lee | ......................... | B01J 3/006 |
| | | | | | 427/577 |

(Continued)

FOREIGN PATENT DOCUMENTS

| JP | 5744540 B2 | 7/2015 |
| KR | 10-0973697 B1 | 8/2010 |
| KR | 100973697 B1 | 8/2010 |

OTHER PUBLICATIONS

Shohei Kanada et al., "Fabrication of graphene on atomically flat diamond (111) surfaces using nickel as a catalyst", Diamond & Related Materials, 2017, pp. 105-109, vol. 75.

*Primary Examiner* — David P Turocy
(74) *Attorney, Agent, or Firm* — Rabin & Berdo, P.C.

(57) ABSTRACT

Provided are a method of manufacturing a diamond-graphene hybrid heat spreader-thermal interface material assembled thermal management material including: (a) preparing a planar diamond base material; and (b) converting a predetermined thickness of at least a partial area of one side or both sides of the diamond base material into vertical graphene, wherein the diamond base material serves as a heat spreader, and a graphene layer formed on the diamond base material serves as a thermal interface material (TIM) or a heat sink, and a method of modulating the diamond-graphene hybrid thermal management material including modulating the thermal management material by attaching a heterogenous member to the surface of the diamond-graphene hybrid thermal management material and pressurizing the attached structure.

14 Claims, 6 Drawing Sheets

(56) References Cited

U.S. PATENT DOCUMENTS

2010/0085713 A1\* 4/2010 Balandin ............... H01L 23/373
                                                        257/E21.27
2013/0157271 A1\* 6/2013 Coursey ................. F25B 29/00
                                                          435/6.12

\* cited by examiner

METHOD OF MANUFACTURING AND MODULARIZING ASSEMBLED THERMAL MANAGEMENT MATERIAL BASED ON DIAMOND-GRAPHENE HYBRID STRUCTURE

CROSS-REFERENCE TO RELATED APPLICATION

This application claims the benefit of Korean Patent Application No. 10-2020-0013828, filed on Feb. 5, 2020, in the Korean Intellectual Property Office, the disclosure of which is incorporated herein in its entirety by reference.

BACKGROUND

1. Field

The present invention relates to a thermal management field of electronic devices, and more particularly, to a method of manufacturing and modulating a multifunctional thermal management material based on diamond plates of which surface is transformed into vertical graphene.

2. Description of the Related Art

As electronic devices are highly integrated with high output power, thermal management is becoming more important therein. In general, for thermal management, a heat spreader is attached to an electronic device that is a heat source, and a heat sink dissipating heat to the outside is additionally attached to the heat spreader as shown in FIG. 1. Depending on the situation, a heat-pipe is additionally attached to the heat spreader or a fan. The heat spreader that efficiently transfers heat from the electronic device is formed of copper with a high thermal conductivity (390 W/mK), carbon fibers (500 to 1000 W/mK in a lengthwise direction), graphite (500 to 1900 W/mK in a horizontal direction and 15 to 20 W/mK in a vertical direction), diamond (1000 to 2000 W/mK), and the like. The heat sink having a fin structure for maximization of surface area is formed of light aluminum (240 W/mK), but there is a problem that a volume thereof is greater than that of an electronic device or a heat spreader by dozens of times.

A thermal interface material (TIM) is used between an electronic device and a material or structure for thermal management thereof. The thermal interface material is prepared by mixing a polymer adhesive (about 1 W/mK) with a thermally conductive material (powder or short fibers) for increasing thermal conductivity, but a low thermal conductivity (about 7 W/mK) of the thermal interface material may cause a bottleneck phenomenon of heat transfer. The thermal interface material may be prepared in the form of a thermal tape. In this case, the thermal conductivity may be in the range of 1 to 4 W/mK. When a heat-pipe is used, a solder or a paste used in direct bonding to the electronic device and having a low thermal conductivity of 27 to 50 W/mK or about 1 W/mK, respectively, may increase heat resistance.

A carbon material is a traditional thermal management material. As the carbon material, a graphite pad (having thickness of about 0.2 mm and thermal conductivity of 8 to 35 W/mK) or a graphite sheet (having thickness of about 25 μm and a thermal conductivity of 500 to 1900 W/mK in the horizontal direction and 15 to 20 W/mK in the vertical direction) is used as a thermal management material. Since the graphite pad has a low thermal conductivity and the graphite sheet is too thin and has a low strength of 650 psi, uses thereof are limited.

Diamond having a three-dimensional structure ($sp^a$) of carbon has a thermal conductivity about 5 times that of copper and is verified as the best thermal management material (1000 to 2000 W/mK). Graphene having a two-dimensional structure ($sp^2$) of carbon is flexible and is reported to have a thermal conductivity of about 5000 W/m, which is about twice that of diamond. With the development of CVD diamond synthesis technology proposed in the 1980s, large-area diamond wafers having a thickness of 1 mm and a diameter of 4" may be manufactured and processed and related infrastructure/technology has been matured. However, diamond has not been applied as a heat dissipation material because a heat sink should be installed due to high heat resistance between the heat spreader and the heat sink (thermal interface material, about 10 W/mK) even when expensive diamond is used to form the heat spreader, failing in reducing size of a module. Therefore, a new approach for effective thermal management is required.

RELATED ART DOCUMENT

Patent Document

Korean Patent No. 10-0973697
U.S. Pat. No. 8,318,268

SUMMARY

The present invention has been proposed to solve various problems including the above problems, and an object of the present invention is to provide a method of manufacturing a diamond-graphene hybrid heat spreader and modulating a heat spreader-heat sink assembly comprising the diamond-graphene hybrid heat spreader. However, problems to be solved are illustrative and the scope of the present invention is not limited thereby.

Additional aspects will be set forth in part in the description which follows and, in part, will be apparent from the description, or may be learned by practice of the presented embodiments.

According to an aspect of the present invention, provided is a method of manufacturing a diamond-graphene hybrid thermal management material, the method including: (a) preparing a planar diamond base material; and (b) converting a predetermined thickness of at least a partial area of one side or both sides of the diamond base material into vertical graphene, wherein the diamond base material serves as a heat spreader, and a graphene layer formed on the diamond base material serves as a thermal interface material (TIM).

In an embodiment of the present invention, the forming of the diamond-graphene hybrid may be performed by hydrogen plasma treatment in process (b).

In an embodiment of the present invention, the hydrogen plasma treatment may be performed at a temperature of 1000° C. to 1500° C.

In an embodiment of the present invention, the process (b) may be performed in a chamber by high-temperature heat treatment.

In an embodiment of the present invention, the high-temperature heat treatment may be performed at a temperature of 1500° C. to 2000° C.

In an embodiment of the present invention, the high-temperature heat treatment may be performed in a hydrogen gas atmosphere.

In an embodiment of the present invention, the process (b) may be performed in a vacuum chamber by laser treatment.

In an embodiment of the present invention, the diamond base material may be a CVD polycrystalline diamond.

In an embodiment of the present invention, the CVD polycrystalline diamond may have a direction of a crystal texture <110>.

In an embodiment of the present invention, the graphene layer may be formed at an acute angle to a horizontal plane of the diamond base material.

In an embodiment of the present invention, the graphene may grow inward from the surface excluding edges of the diamond base material in the process (b).

According to another aspect of the present invention, provided is a method of manufacturing a diamond-graphene hybrid heat spreader-heat sink assembled thermal management material, the method including: (a) preparing a CVD diamond base material having an unpolished growth surface; and (b) converting the CVD diamond base material into graphene by a predetermined thickness, wherein a graphene layer formed on the growth surface of the CVD diamond base material serves as a heat sink.

In an embodiment of the present invention, the method may further include (c) widening a surface area of graphene by forming holes in the graphene layer formed on the growth surface.

According to another aspect of the present invention, provided is a method of modulating a diamond-graphene hybrid thermal management material, the method including: preparing the diamond-graphene hybrid heat spreader-thermal interface material assembled thermal management material; and modulating the thermal management material by attaching a heterogenous member to the surface of the thermal management material and pressurizing the attached structure.

In an embodiment of the present invention, the pressurizing may be performed at a pressure of 1 to 200 psi.

In an embodiment of the present invention, the heterogenous member may be a fan or a heat-pipe.

In an embodiment of the present invention, the heterogenous member may be a heat spreader or a heat sink.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
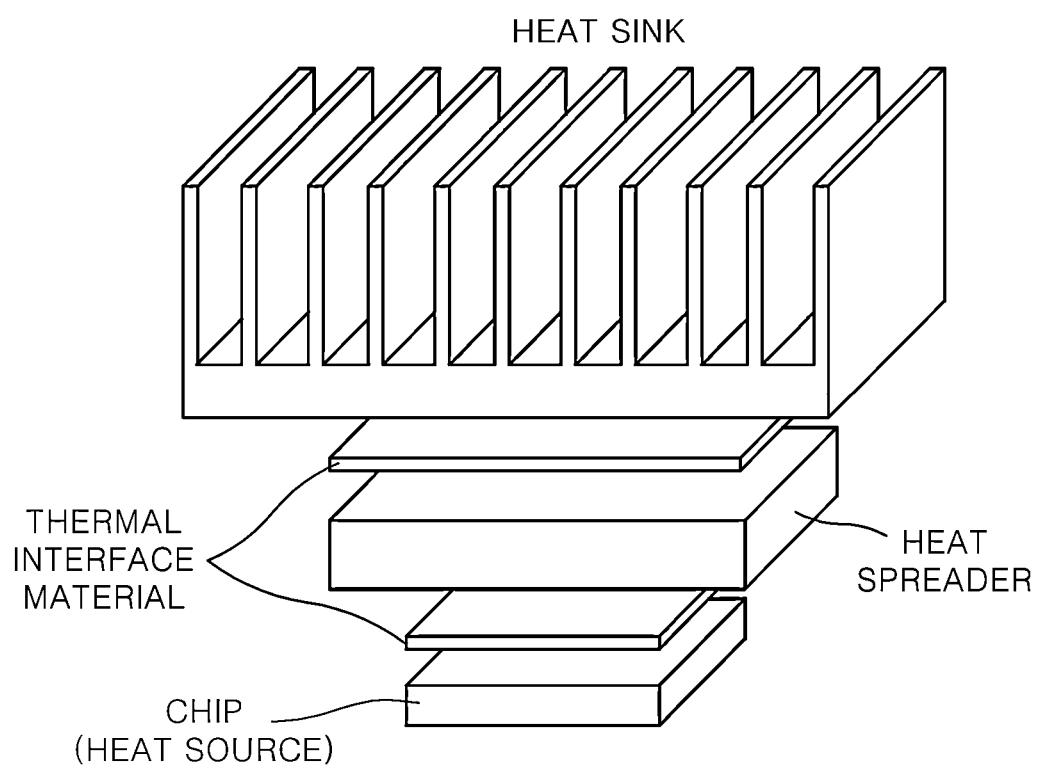
FIG. 1 is a view illustrating a conventional thermal management module.

Hereinafter, embodiments of the present disclosure will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the concept of the invention to those skilled in the art. In the drawings, the thicknesses of layers and regions are exaggerated for clarity.

Diamond-Graphene Hybridization

In an embodiment of the present invention, Diamond-graphene hybridization is performed by phase transformation of a surface of a diamond plate into vertical graphene. This surface hybridization of a diamond plate with vertical graphene may be performed by 1) high-density plasma treatment for chemical vapor deposition (CVD) diamond synthesis, 2) high-temperature heat treatment, or 3) laser treatment in a vacuum container. The hybridization process may be performed in a hydrogen atmosphere.

In an embodiment of the present invention, when diamond is subjected to hydrogen plasma treatment at a high temperature of 1000 to 1500° C., graphenization (graphitization) proceeds inward from the surface. This is because the plane {111} of diamond is converted into graphene layers due to their crystallographical similarity.

In an embodiment of the present invention, the surface hybridization of a diamond plate with vertical graphene by the high-temperature heat treatment may be performed in a vacuum chamber in a hydrogen atmosphere at a temperature of 1500 to 2000° C.

In an embodiment of the present invention, the surface hybridization of a diamond plate with vertical graphene using a laser may be performed in a vacuum container in which a hydrogen atmosphere is able to be maintained. In the vacuum container, a sight glass through which laser beams pass, a stage on which a sample is placed, and a port for supplying hydrogen gas may be installed. In this case, after placing a diamond base material on the stage in the vacuum container, the container was maintained in a certain vacuum state. Subsequently, a predetermined pressure was maintained by supplying hydrogen gas, and then the surface of the diamond base material may be converted into graphene by laser irradiation via the sight glass.

Diamond-Graphene Hybrid Thermal Management Material

In a diamond-graphene hybrid structure prepared by the method described above, the unconverted portion of diamond serves as a heat spreader and flexible graphene (forest) bonded to the diamond serves as a thermal interface material (TIM) or a heat sink. That is, the diamond-graphene hybrid heat spreader according to the present invention may be a 'heat sink-heat spreader-TIM' or 'TIM-heat spreader-TIM' assembled thermal management material. As used herein, the term "graphene forest" refers to a structure in which 'graphene' is vertically densely packed' on the surface of the diamond base material.

FIG. 2A to 2D show a graphene-diamond-graphene hybrid 'TIM-heat spreader-TIM' assembled thermal management material manufactured according to an embodiment of the present invention. Graphene layers formed on both sides of the diamond base material serve as TIMs. Since the assembled thermal management material having the 'TIM-heat spreader-TIM' structure may be pressurized to an electronic device or other thermal management materials/devices in actual use, the both sides of the diamond plate to be converted into the graphene layers may be processed flat.

Figure 3:
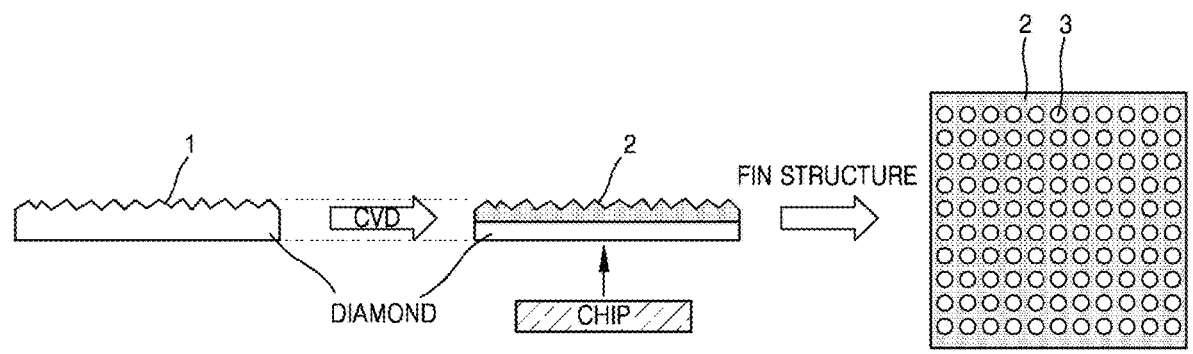
FIG. 3 is a schematic diagram illustrating a diamond based multifunctional thermal management materials (heat spreader-heat sink) manufactured according to an embodiment of the present invention.

FIG. 3 shows a graphene-diamond-graphene hybrid heat spreader, that is, a 'heat sink-heat spreader-TIM' assembled thermal management material manufactured according to an embodiment of the present invention. In this case, an unpolished CVD polycrystalline diamond whose growth surface is composed of rough (faceted) grains may be used. That is, the irregularities on the surface of the growth surface converted into a graphene forest widens the surface area and to serve as a heat sink (generally having a fin structure to maximize the surface area). In order to maximize the surface area of graphene, holes may further be formed in the graphene layer by dry etching or laser processing. The holes formed in graphene may maximize heat dissipation by convection in the same manner as the fin structure.

Thermal Management Modulation of Diamond-graphene Hybrid Thermal Management Material In 'thermal management modulation' where the diamond-graphene hybrid thermal management material, in which the surface of diamond is converted into graphene to a predetermined thickness as described above, is physically attached/connected to an electronic device, as a heat source, or other thermal management materials/structures, pressure may be applied thereto to minimize heat resistance.

Figure 4A:
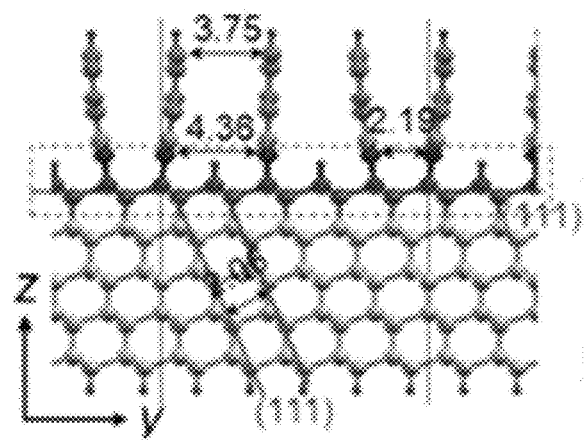
FIGS. 4A and 4B show an atomic structure model showing the interface of a diamond-graphene hybrid heat spreader prepared according to an embodiment of the present invention.
Figure 4B:
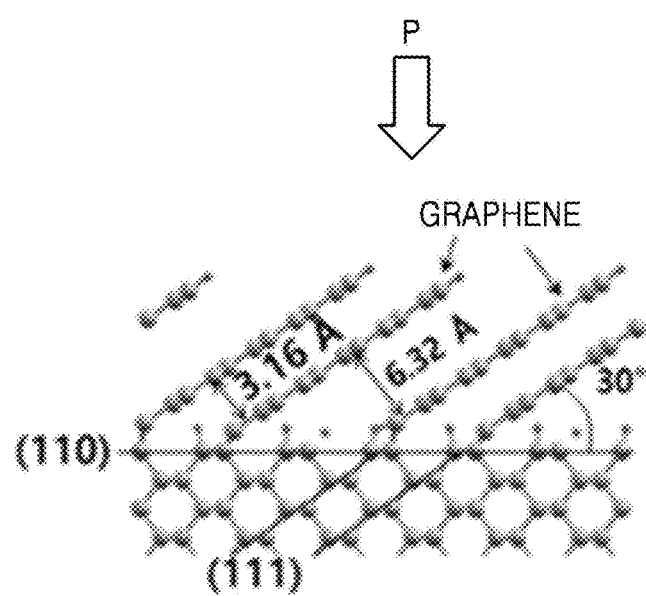

In the present invention, the graphene forest is formed at a right angle or acute angle to the horizontal plane of a diamond substrate by a crystallographic relationship. The angle of the graphene to the horizontal plane of the diamond may vary according to the type of a crystal plane constituting the surface of the diamond. As shown in FIG. 4A, when the surface of the diamond has the plane (111), the graphene is formed at 90°. As shown in FIG. 4B, when the surface of the diamond has the plane (110), the graphene is formed at 30°. The CVD polycrystalline diamond generally has a crystal texture <110> (In this case, a polished surface is formed of the lattice plane (110). Thus, when a CVD polycrystalline diamond substrate is used, graphene is formed at 30° with the surface of the diamond plane.

In modulation by pressurizing, the angle of graphene on diamond is important. When graphene is formed at a right angle to the horizontal plane of the diamond substrate as shown in FIG. 4A, the graphene may break by a pressure applied in a direction perpendicular to the horizontal plane of the diamond substrate. On the contrary, as shown in FIG. 4B, when graphene layers constituting the graphene forest are formed respectively at an acute angle of about 30° to the horizontal plane of the diamond base material (i.e., interface between diamond and graphene), the graphene layers of the graphene forest are stacked on inclined surfaces with respect to the pressure (P of FIG. 4B) and elastically deformed without being destroyed. Therefore, the diamond base material may be a CVD diamond substrate having the crystal texture <110>. The pressurizing process may be performed at a pressure of 1 to 200 psi.

Figure 2A:
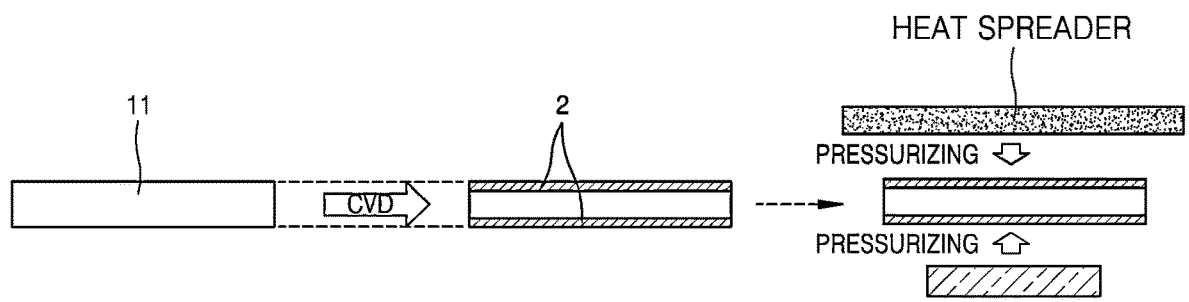
FIGS. 2A and 2B are cross-sectional views illustrating a graphene-diamond hybrid heat spreader and a thermal management module thereof.
Figure 2B:
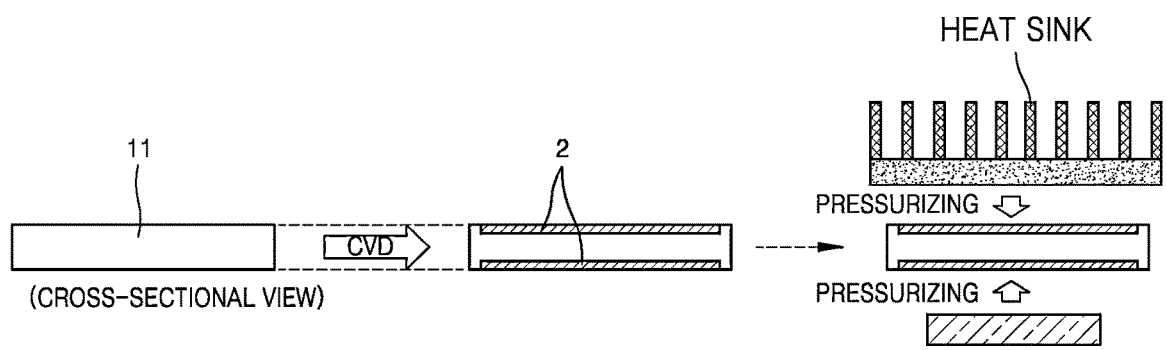
Figure 2C:
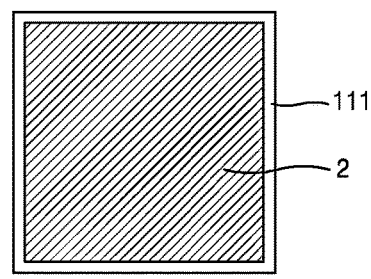
FIGS. 2C and 2D are plane views illustrating diamond-graphene hybrid structure heat spreaders.
Figure 2D:
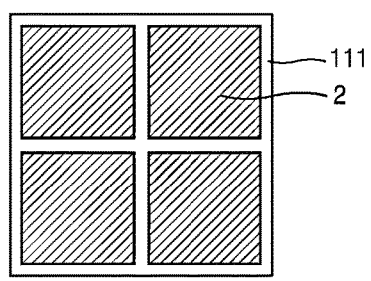

In addition, as shown in FIG. 2B, when diamond edges are remained during the formation of graphene on the surface of the diamond, the thermal management material may be horizontally maintained and deformation of graphene formed at an acute angle may be minimized, thereby maximizing heat transfer efficiency during modulation by pressurizing.

Hereinafter, the present invention will be described in more detail with reference to the following examples. However, these examples are made only for illustrative purposes, and the present invention may not be construed as being limited to those examples.

Example 1

A heat spreader-heat sink assembled thermal management material was manufactured using a direct-current (DC) plasma CVD device for diamond synthesis. An unpolished CVD (polycrystalline) diamond plate sample (having a size of 1×1 cm$^2$, a thickness of about 0.5 mm, and a thermal conductivity of about 1000 W/mK) was placed in the device on a positive electrode thereof such that a growth surface (having surface irregularities of about 50 μm equivalent to approximately 10% of a thickness thereof) of the sample faces upward and is exposed to plasma, followed by hydrogen plasma treatment performed in a hydrogen atmosphere. The treatment was performed in an input power of 2.5 kW at a hydrogen gas pressure of 100 Torr at a gas flow rate of 200 sccm at a temperature of 1320° C. for 10 minutes.

Figure 5A:
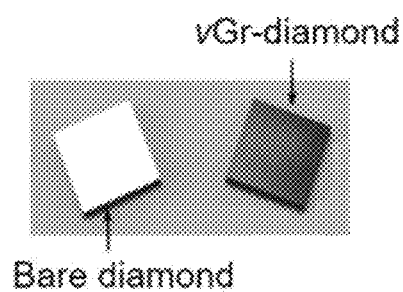
FIG. 5A shows an image of a bare diamond and a graphene-diamond hybrid structure manufactured according to an embodiment of the present invention.
Figure 5B:
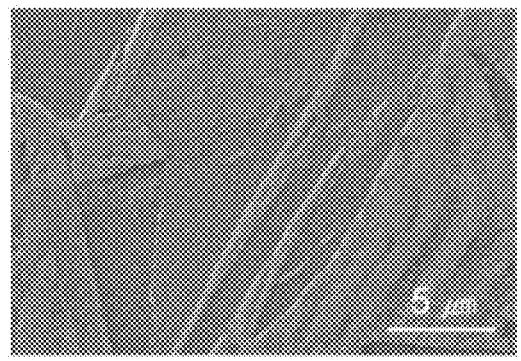
FIG. 5B shows a SEM image of a graphene side of a diamond-graphene hybrid structure manufactured according to an embodiment of the present invention.
Figure 5C:
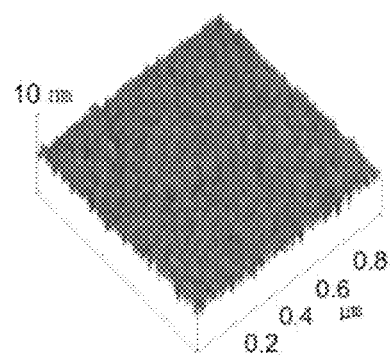
FIG. 5C shows AFM image of a graphene side of a diamond-graphene hybrid structure manufactured according to an embodiment of the present invention.
Figure 5D:
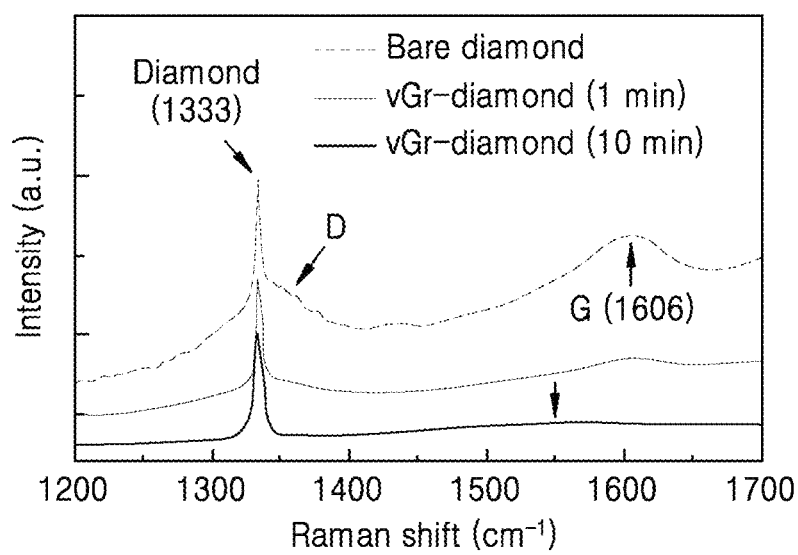
FIG. 5D shows Raman spectra of a diamond-graphene hybrid structure manufactured according to an embodiment of the present invention.
Figure 6A:
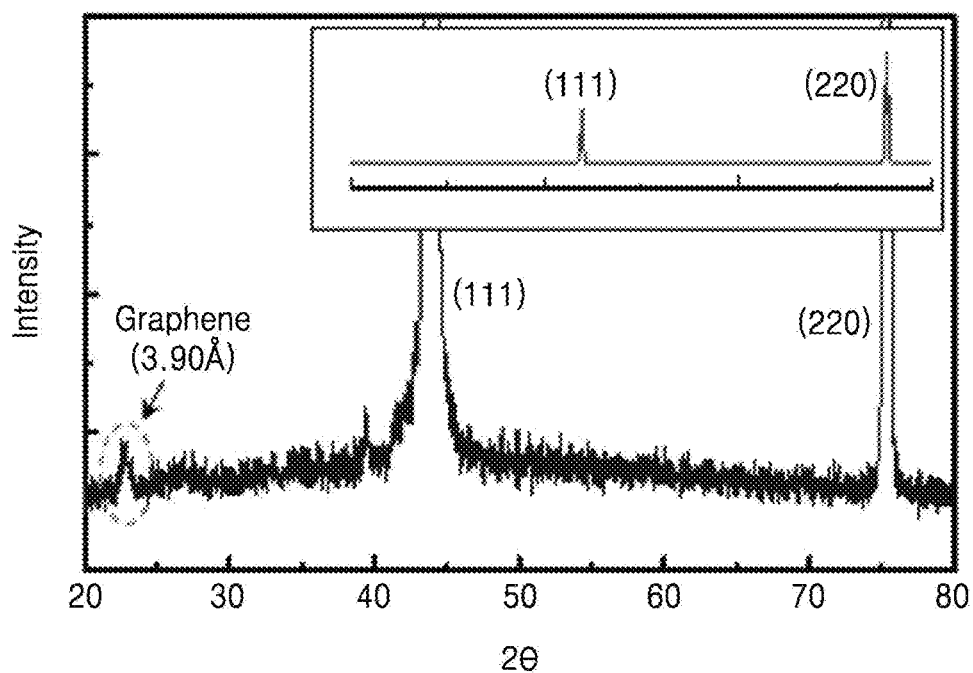
FIGS. 6A and 6B show XRD patterns of a diamond-graphene hybrid structure according to an embodiment of the present invention.
Figure 6B:
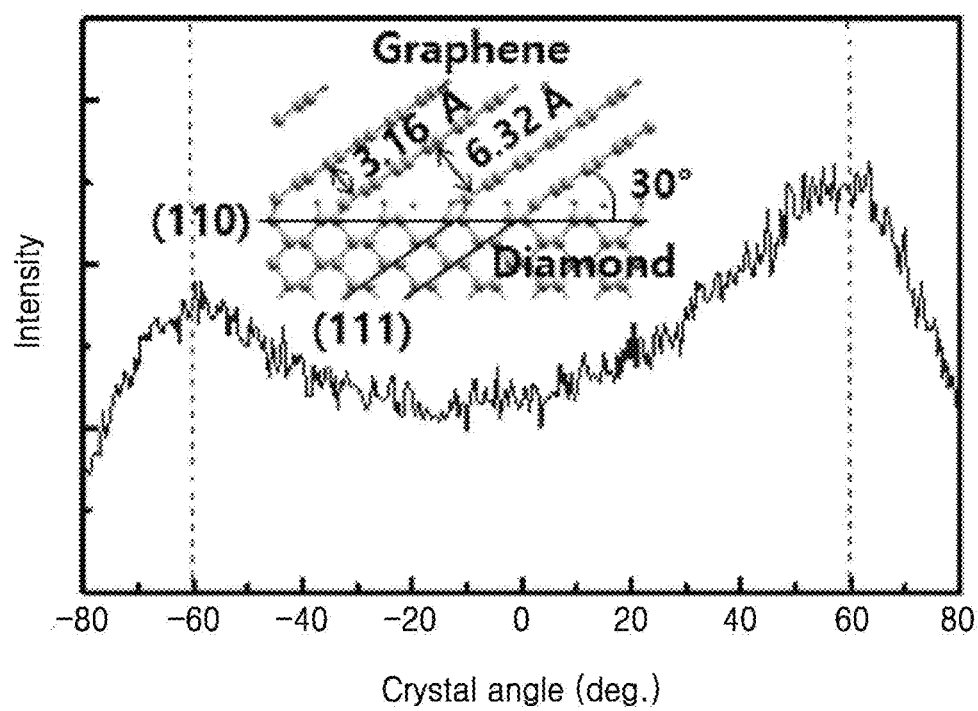

As a result of analyzing the hydrogen plasma-treated sample using an optical microscope while pressing the sample with tweezers, one portion of diamond was converted into graphene to about 0.2 mm from the top surface, and the other portion remained as hard diamond. Referring to FIG. 5D, the hybrid structure was confirmed by the G peak (generally observed at 1582 cm$^{-1}$) shifted to 1603 cm$^{-1}$ in Raman spectroscopy. This is because compressive stress applied to graphene (graphite) due to hybridization. In XRD analysis of the sample, a peak <110> stronger than a peak <111> (inset of FIG. 5A) shows that the diamond substrate has the crystal texture <110>, and a peak at 3.90 Å indicates the presence of graphene (graphite). ±60° peaks shown in a rocking curve (FIG. 6B) with respect to the peak at 3.90 Å confirms that graphene is inclined by 60° with respect to the vertical direction of the diamond substrate (i.e., inclined by 30° with respect to the horizontal direction of the substrate). An SEM pattern shown in FIG. 5B is formed because graphene (i.e., graphene forest) partially lie different directions (although the angles are the same as 30°). The unique SEM pattern (FIG. 5B), the Raman shift results (FIG. 5D), and the XRD rocking curve (FIG. 6B) of the graphene-diamond structure obtained as described above are evidence of a hybrid structure since they cannot be obtained when two materials independently exist.

Thermophysical properties of the graphene-diamond-based assembled thermal management material (heat sink-heat spreader) manufactured in Example 1 above were evaluated. Heat transfer performance of the graphene-diamond-based assembled thermal management material was improved by 30% when compared with a planar diamond heat spreader. This is interpreted because the top portion of diamond (i.e., graphene layer) serves as a heat sink.

Example 2

A heat spreader-heat sink assembled thermal management material was manufactured by high-temperature heat treatment using the CVD diamond plate sample used in Example 1. The sample was placed in a vacuum furnace such that a growth surface of the sample faces upward, the vacuum furnace was vacuumized to $10^{-6}$ Torr, and the temperature was raised to 1800° C. in a stepwise manner. While supplying hydrogen gas at a flow rate of 100 sccm, the treatment was maintained for 30 minutes.

As a result of analyzing the high-temperature heat-treated sample using an optical microscope while pressing the surface of the sample with tweezers, diamond was converted into graphene to a thickness of about 200 μm. A hybrid structure was confirmed by the G peak shift (from 1582 $cm^{-1}$ to 1603 $cm^{-1}$) in Raman spectroscopy.

Example 3

A thermal interface material-heat spreader-thermal interface material assembled thermal management material was manufactured using a CVD diamond plate, both surfaces of which were polished. Both sides of a sample were subjected to plasma treatment under the same conditions as those of Example 1 above. After performing plasma treatment on one surface for 1 minute, the experiment was terminated, and then the sample was turned over, followed by plasma treatment for 1 minute under the same conditions.

As a result of analyzing the surface of the plasma-treated sample using an optical microscope while pressing the surface with tweezers, both surfaces were converted into graphene to about 10 μm. A hybrid structure was confirmed by the G peak shift (from 1582 $cm^{-1}$ to 1598 $cm^{-1}$) in Raman spectroscopy.

The graphene-diamond-graphene thermal management material has a thermal conductivity of about 1000 W/mK which is the same as that of the diamond plate before hybridization with graphene. This indicates that there was no heat resistance between graphene and diamond.

Changes in heat resistance, with respect to pressure, of the heat spreader-thermal interface material assembled thermal management material manufactured in Example 3 were evaluated when the material was pressurized to a heat source. Heat resistance (0.3 $cm^{2.\circ}$ C./W) measured before applying a pressure fractionally decreased until 100 psi and saturated at about 0.02 $cm^{\circ}$ C./W.

The thermal interface material-heat spreader-thermal interface material assembled thermal management material manufactured in Example 3 was pressurized to a 10 W/$cm^2$ heat source device at a pressure of 100 psi, and thermo-physical properties thereof were evaluated. Heat resistance when using the graphene-diamond-graphene hybrid material was about 0.01 K·$cm^2$/W, which was about 10% of that of a conventional diamond plate heat spreader (thermal interface material-diamond plate-thermal interface material).

Example 4

A thermal interface material-heat spreader-thermal interface material assembled thermal management material, like that of Example 3, was manufactured by laser treatment. A sample was placed in a vacuum container prepared to enable laser treatment in a vacuum (hydrogen) atmosphere and a laser beam scan target was prepared in a square shape having a size of 11×11 $mm^2$ to be slightly greater than the sample. Then, laser treatment was performed by linear scanning 10 times with linear laser beams having a length of 11 mm. During the laser treatment, a pressure of hydrogen gas was 50 Torr, and the temperature of the diamond substrate (heated by the laser treatment) was not separately controlled. After turning over the sample, laser treatment was performed under the same conditions.

As a result of analyzing the laser-treated sample using an optical microscope while pressing both sides of the sample with tweezers, the surfaces were converted into graphene to a thickness of about 5 μm from the top surfaces. A hybrid structure was confirmed by the G peak (generally observed at 1582 $cm^{-1}$) shifted to 1598 $cm^{-1}$.

Example 5

A thermal interface material-heat spreader-thermal interface material assembled thermal management material, like that of Example 3, was manufactured by laser treatment, such that the thermal interface material-heat spreader-thermal interface material assembled thermal management material had diamond edges each with a width of about 0.5 mm. For this, a laser beam scan target was prepared in a square shape having a size 9×9 $mm^2$, and laser treatment was performed by linear scanning both surfaces using linear laser beams having a length of 9 mm as in Example 3.

As a result of analyzing the laser-treated sample using an optical microscope while pressing the later-treated portion with tweezers, the surface was converted into graphene to about 5 μm. A hybrid structure was confirmed by the G peak shift (from 1582 $cm^{-1}$ to 1605 $cm^{-1}$) in Raman spectroscopy.

According to the diamond hybrid structure-based assembled thermal management material and the method of modulating the pressurized thermal management material using the same according to the present invention as described above, heat resistance is considerably reduced at a thermal interface to improve thermal management capability and also size of a thermal management module may be reduced. However, the scope of the present invention is not limited by these effects.

While one or more embodiments of the present invention have been described with reference to the drawings, it will be understood by those of ordinary skill in the art that various changes in form and details may be made therein without departing from the spirit and scope of the present invention as defined by the following claims.

What is claimed is:

1. A method of manufacturing a diamond-graphene hybrid thermal management material, the method comprising:
    (a) preparing a planar diamond base material; and
    (b) converting a predetermined thickness of at least a partial area of one side or both sides of the diamond base material into vertical graphene,
    wherein the diamond base material serves as a heat spreader, and a graphene layer formed on the diamond base material serves as a thermal interface material (TIM);
    wherein the diamond base material is a CVD polycrystalline diamond having a direction of a crystal texture <110> and a (110) plane surface;
    wherein the vertical graphene is formed at 30° with respect to the (110) plane surface of the CVD polycrystalline diamond; and
    wherein heat resistance between the diamond base material and the graphene layer is zero.

2. The method of claim 1, wherein the process (b) is performed by hydrogen plasma treatment.

3. The method of claim 2, wherein the hydrogen plasma treatment is performed at a temperature of 1000° C. to 1500° C.

4. The method of claim 1, wherein the process (b) is performed in a chamber by high-temperature heat treatment.

5. The method of claim 4, wherein the high-temperature heat treatment is performed at a temperature of 1500° C. to 2000° C.

6. The method of claim 4, wherein the high-temperature heat treatment is performed in a hydrogen gas atmosphere.

7. The method of claim 1, wherein the process (b) is performed in a vacuum chamber by laser treatment.

8. The method of claim 1, wherein the graphene grows inward from the surface excluding edges of the diamond base material in the process (b).

9. A method of manufacturing a diamond-graphene hybrid heat spreader-heat sink assembled thermal management material, the method comprising:
   (a) preparing a CVD diamond base material having an unpolished growth surface; and
   (b) converting the CVD diamond base material into vertical graphene by a predetermined thickness,
   wherein a graphene layer formed on the growth surface of the CVD diamond base material serves as a heat sink; and
   wherein the CVD diamond base material having a direction of a crystal texture <110> and a (110) plane surface;
   wherein the vertical graphene is formed at 30° with respect to the (110) plane surface of the CVD polycrystalline diamond; and
   wherein heat resistance between the diamond base material and the graphene layer is zero.

10. The method of claim 9, further comprising (c) widening a surface area of graphene by forming holes in the graphene layer formed on the growth surface.

11. A method of modulating a diamond-graphene hybrid thermal management material, the method comprising:
    preparing the diamond-graphene hybrid thermal management material manufactured according to claim 1; and
    modulating the thermal management material by attaching a heterogenous member to the surface of the thermal management material and pressurizing the attached structure.

12. The method of claim 11, wherein the pressurizing is performed at a pressure of 1 to 200 psi.

13. The method of claim 11, wherein the heterogenous member is a fan or a heat-pipe.

14. The method of claim 11, wherein the heterogenous member is a heat spreader or a heat sink.

* * * * *